(12) United States Patent
Masutani et al.

(10) Patent No.: US 6,291,136 B1
(45) Date of Patent: Sep. 18, 2001

(54) METHOD OF MANUFACTURING A LIQUID CRYSTAL DISPLAY

(75) Inventors: Yuichi Masutani; Kazuhiro Kobayashi, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/245,845

(22) Filed: Feb. 8, 1999

(30) Foreign Application Priority Data

Jul. 14, 1998 (JP) .................................................. 10-198261

(51) Int. Cl.[7] ............................. G03F 7/00; G02F 1/1343
(52) U.S. Cl. ........................... 430/312; 430/319; 430/394
(58) Field of Search ............................... 430/22, 30, 312, 430/319, 321, 394; 438/30

(56) References Cited

U.S. PATENT DOCUMENTS

| 5,668,019 | 9/1997 | Kobayashi et al. . | |
| 5,859,690 | * 1/1999 | Toguchi | 355/53 |
| 6,020,214 | * 2/2000 | Watanabe et al. | 438/30 |

FOREIGN PATENT DOCUMENTS

| 3-71326 | 7/1991 | (JP) . |
| 4-305651 | 10/1992 | (JP) . |
| 10-096964 | * 4/1998 | (JP) . |

OTHER PUBLICATIONS

M. Oh–E, et al., "S23–1 Principles and Characteristics of Electro–Optical Behaviour With In–Plane Switching Mode," Asia Display '95, pp. 577–580.

* cited by examiner

*Primary Examiner*—John A. McPherson
(74) *Attorney, Agent, or Firm*—Oblon, Spivak, McClelland, Maier & Neustadt, P.C.

(57) ABSTRACT

The present invention provides a liquid crystal display apparatus with high reliability in which accuracy of a width of a comb-shaped electrode is improved in the plane, particularly, at a boundary of divisional exposure, display unevenness of the boundary portion of divisional exposure is reduced in a lateral direction electric field method, and provides a manufacturing method thereof. In the method of manufacturing the liquid crystal display apparatus of the present invention wherein the liquid crystal display apparatus is manufactured so that a counter electrode opposite to a pixel electrode is provided and an electric field whose direction is horizontal to the surface of a substrate is applied between the pixel electrode and the counter electrode and thus liquid crystal is driven, when a pixel section is exposed, the exposure is carried out repeatedly by using one mask so that the pattern is formed. Moreover, according to this manufacturing method, a liquid crystal display apparatus having high reliability, in which display unevenness at the boundary portion of divisional exposure is reduced, is obtained.

6 Claims, 12 Drawing Sheets

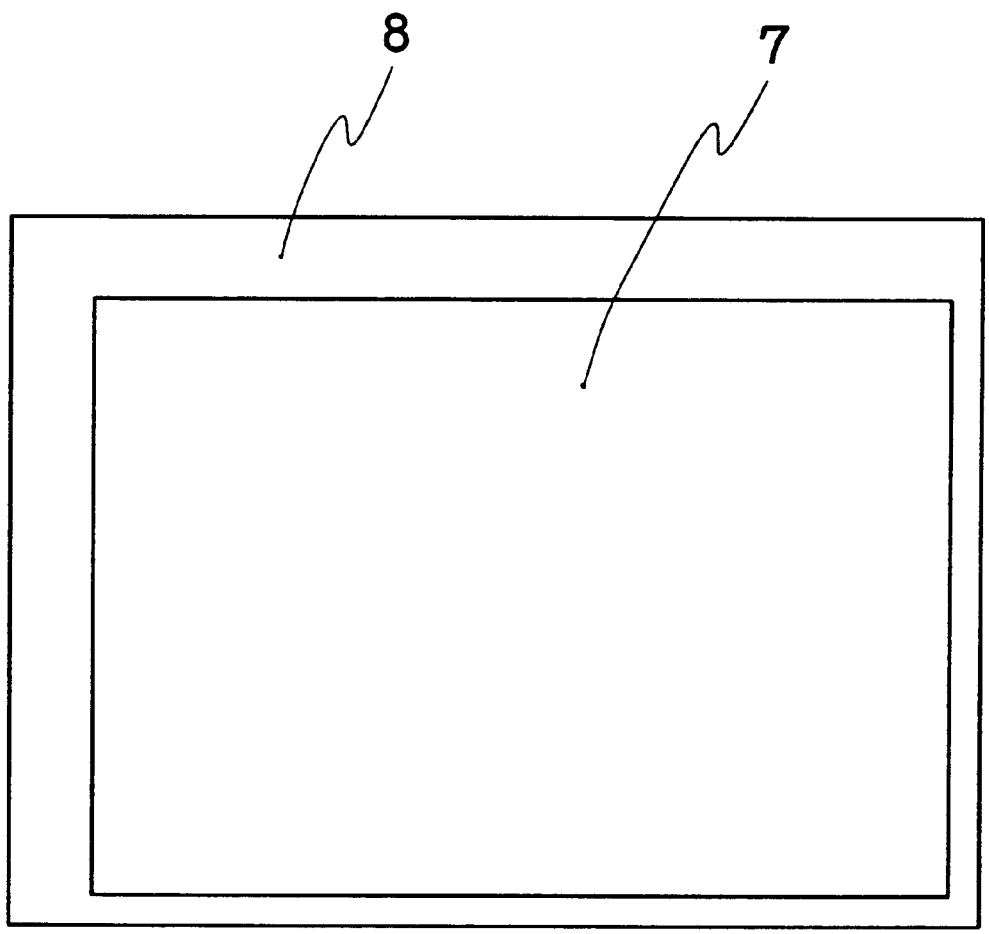

METHOD OF MANUFACTURING A LIQUID CRYSTAL DISPLAY

BACKGROUND OF THE INVENTION

The present invention relates to an active matrix liquid crystal display apparatus and a manufacturing method thereof.

In an active matrix liquid crystal display apparatus, a method in which a direction of an electric field applied to the liquid crystal is parallel with a substrate (hereinafter, "lateral direction electric field method") is used mainly as a method of obtaining a wide viewing angle (for example, Japanese Unexamined Patent Publication No. 254712/1996). When adopting this method, it is clear that a change in contrast when the viewing angle direction is changed and inversion of gray scale level can be small (for example, M.Oh-e and the others, Asia Display '95.pp.577–580).

FIG. 9 schematically shows an arrangement of one pixel of a substrate of a TFT (thin film transistor) array which is an essential element of a conventional active matrix liquid crystal display apparatus using this method. An image signal is supplied from a signal line 2 to a pixel electrode 6 via a TFT 4 switched by a gate line 1, and an electric field whose direction is parallel with the substrate is formed between the pixel electrode 6 and a counter electrode 5 so that liquid crystal is driven. The counter electrode 5 is connected with a common line 3. The substrate of the TFT integrate apparatus is composed of a pixel section 7, the pixel of which are arranged in a matrix form, and a terminal section 8 for inputting a signal from a circuit (FIG. 10). A counter substrate is laminated onto the pixel section 7 with the liquid crystal being sandwiched therebetween, and a circuit for transmitting an image signal to the gate line and the signal line is mounted to the terminal section 8 so that the liquid crystal display apparatus is manufactured.

The following will describe a method of manufacturing the substrate of the TFT array which is a component of the active matrix liquid crystal display apparatus on reference to a sectional view showing the process in FIG. 11(a) to 11(d). The counter electrode 5 and the common line 3 are formed on a glass substrate 10 simultaneously with the gate line 1 (FIG. 11(a)). The gate line 1 serves also as a gate electrode of the TFT. Next, after a gate insulating film 11 is deposited on the whole surface, amorphous silicon 12 and amorphous silicon 13 with which impurity was doped are formed (FIG. 11(b)). The signal line 2 and the pixel electrode 6 are formed at the same time when a source/drain area 14 of the TFT is formed. Thereafter, the amorphous silicon 13 with which impurity was doped is removed by dry etching or the like using the source/drain area as a mask (FIG. 11(c)). Finally, a passivation film 9 is formed on the whole surface by a transparent insulating film made of silicon nitride, silicon oxide or the like (FIG. 11(d)). The respective layers are formed by the processes of deposition, photolithography and etching. The photolithography process is a method such that coating, exposure and development of a photoresist are carried out so that the photoresist is formed into a desired shape. The exposure is the core process of the all, and in the manufacturing of the active matrix liquid crystal display apparatus, one of the stepper method and the mirror projection method is mainly adopted. In the stepper method, the liquid crystal display apparatus is divided into two or more areas, and while the stage is being moved, the exposure is carried out with a mask being exchanged in every area. In the mirror projection method, the liquid crystal display apparatus is not divided, and one large mask and a glass substrate are scanned integrally and the exposure is carried out collectively. In the stepper method, since accuracy of lamination between the respective layers is high in the whole area of the screen, the characteristic, capacity and the like of the TFT become uniform in the plane, so a DC voltage component which is generated due to the non-uniformity of the characteristic and capacity in the plane can be small, and thus there is an advantage that the liquid crystal display apparatus, in which a liquid crystal material is not easily deteriorated and which has high reliability, can be manufactured. Meanwhile, in the mirror projection method, since the exposure is carried out collectively, there is an advantage such that that throughput can be improved. FIG. 3 shows a conventional divisional exposing method in the case of using the stepper method. The pixel section 7 and the terminal section 8 shown in FIG. 10 are divided into some areas (in the drawing, divided into four areas), and the areas are exposed respectively by using different masks.

In the case where a liquid crystal display apparatus using the lateral direction electric field method is manufactured by the stepper method, as mentioned above, the liquid crystal display apparatus with high reliability can be manufactured, but there arises a problem that a boundary where the divisional exposure is carried out is detected as display unevenness. Also in a liquid crystal display apparatus adopting the TN method using a longitudinal direction electric field, a boundary is occasionally detected as display unevenness in a portion where the lamination between the respective layers is shifted greatly, but in the lateral direction electric field method, a boundary is detected as display unevenness even when the lamination is not shifted, and the boundary is detected more easily. It is an object of the present invention to provide a liquid crystal display apparatus, in which accuracy in a width of a comb-shaped electrode is improved in the plane (particularly in a boundary of divisional exposure), and in a lateral direction electric field method, display unevenness in the boundary portion of the divisional exposure is reduced and simultaneously high reliability is obtained, and to provide a manufacturing method thereof.

FIG. 12 is a result of obtaining a relationship between a changing amount of an electrode width and a changing rate of luminance according to an experiment. As a result, it was clear that in the lateral direction electric field method, a change in the electrode width caused a change in luminance. From FIG. 12, it is found that in order to suppress the changing rate of luminance to not more than 6%, for example, scattering of the electrode width (permissible value of the electrode width) should be suppressed to not more than about 0.3 $\mu$m. In this case, the electrode width is 9 $\mu$m. When the changing rate of luminance in the boundary is not less than about 6%, the boundary portion of divisional exposure is detected clearly. Therefore, in this case, it is necessary to suppress a difference between the electrode widths in the boundary of the divisional exposure to not more than about 0.3 $\mu$m in the liquid crystal display apparatus using the lateral direction electric field method. The intensity of the lateral direction electric field is considered to be proportional to the electrode width, and the above-mentioned permissible value is also considered to be proportional to the electrode width. Therefore, it is found that the following (please see formula (1)) relation between a limit value ($\Delta W$) of the permissible value of the electrode width and a design value (S) of the electrode width in the boundary of divisional exposure should be satisfied.

$$\Delta W < 0.3 \times S/9 = S/30 \qquad (1)$$

Also in conventional TFT-LCD using the TN method, a change in luminance in a boundary of exposure is a problem, and it is caused mainly by parasitic capacity of TFT or the like. As a countermeasure against this problem, as disclosed in Japanese Unexamined Patent Publication No. 305651/1992, accuracy of lamination is improved, and storage capacitance is increased, a boundary is made to be zigzag so as to be unclear, and a boundary of exposure between a gate electrode and a source/drain electrode are in different positions.

SUMMARY OF THE INVENTION

In the aforementioned publication, in order to arrange the characteristic of the TFT and the parasitic capacitance of the TFT in respective exposed areas, a pixel portion is exposed repeatedly by using one mask in a layer which is a component of the TFT. The problem at this time is an error of the position (an error of lamination of the gate electrode, source/drain electrode and the like composing the thin film transistor), and as described in the aforementioned publication, the error is about 1 to 2 $\mu$m. On the contrary, the problem of the present invention is the width of the comb-shaped electrode, and it is an object of the present invention to suppress the change in the electrode width at a boundary of the divisional exposure to not more than 0.2 to 0.5 $\mu$m and to reduce the change in luminance. This is a technical problem which is peculiar to the lateral direction electric field method.

It is considered that main causes for the change in the electrode width at the boundary portion of divisional exposure are a difference in a dimension between masks, in-plane distribution exposure amount of an exposing apparatus (stepper), and deviation of a shutter speed of the exposing apparatus. The present invention suppresses these influences so as to suppress the display unevenness of the boundary portion of divisional exposure.

According to a first aspect, in order to reduce a difference in dimension of masks, different masks are not used on both sides of the boundary portion, but the same mask is used so that patterning is carried out. As a result, an influence due to a difference in dimension between masks is eliminated, and only a difference in dimension of one mask (difference in right and left sides or upper and lower sides) causes a change in an electrode width due to the mask. However, when this method is used, a pixel section and a terminal section are divided so as to be exposed, so a number of times of the exposure is generally increased, and thus the throughput is deteriorated. Therefore, this method may be used only for layers where a pixel electrode and a counter electrode are formed. Moreover, when the dry etching method is used for producing a mask, a difference in dimension (in particular, difference in right and left sides and difference in upper and lower sides) of the mask is reduced.

According to a second aspect, in order to suppress an influence of an exposing amount distribution of an exposing apparatus, an area on which exposure is carried out once is reduced as small as possible. However, this increases a number of times of divisional exposure, and the throughput is deteriorated. Therefore, an exposed area of only the layers where a pixel electrode and a counter electrode are formed is reduced.

Further, when the pixel electrode and the counter electrode are formed on different layers, the boundary of divisional exposure should be in different positions of the layers.

Further, the layers where the pixel electrode and the counter electrode are formed are formed by the mirror projection method, and the layer where the thin film transistor is formed is formed by the stepper method.

In addition, a thick photoresist, which is used for forming the layers where the pixel electrode and the counter electrode are formed, is used and the exposing time is set longer.

Furthermore, a phase shift mask is used as a mask for the exposure on the layers where the pixel electrode and the counter electrode are formed. In addition, as a mask for the exposure on the layers where the pixel electrode and the counter electrode are formed, a mask, whose accuracy is higher than that used on the other layers whose in-plane tolerance is not more than ±S/60 $\mu$m, is used.

BRIEF EXPLANATION OF THE DRAWINGS

FIG. 10 is an explanatory view showing a pixel section and a terminal section of conventional TFT array;

DETAILED DESCRIPTION

EMBODIMENT 1

Figure 1:
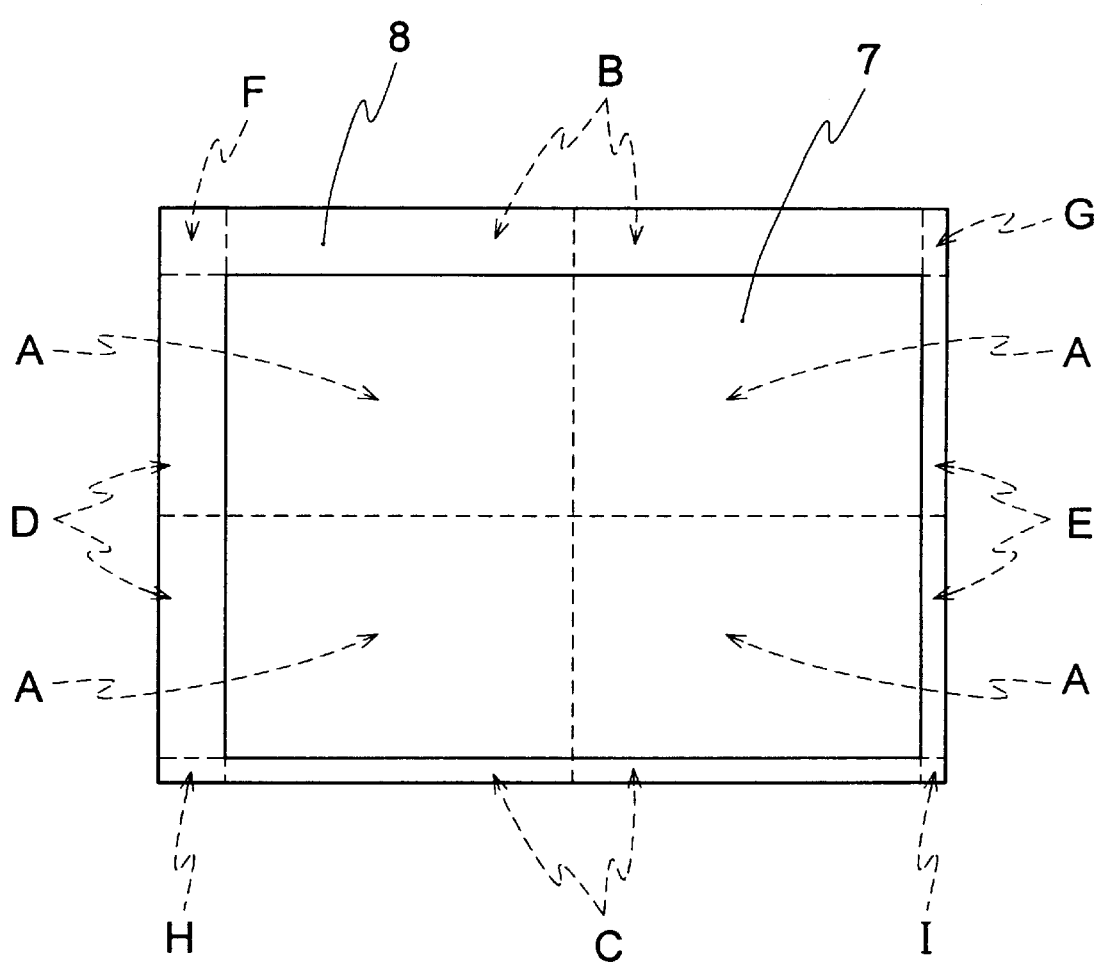
FIG. 1 is an explanatory view showing an example of a method of divisional exposure of a TFT array substrate of EMBODIMENT 1 of the present invention.
Figure 2A:
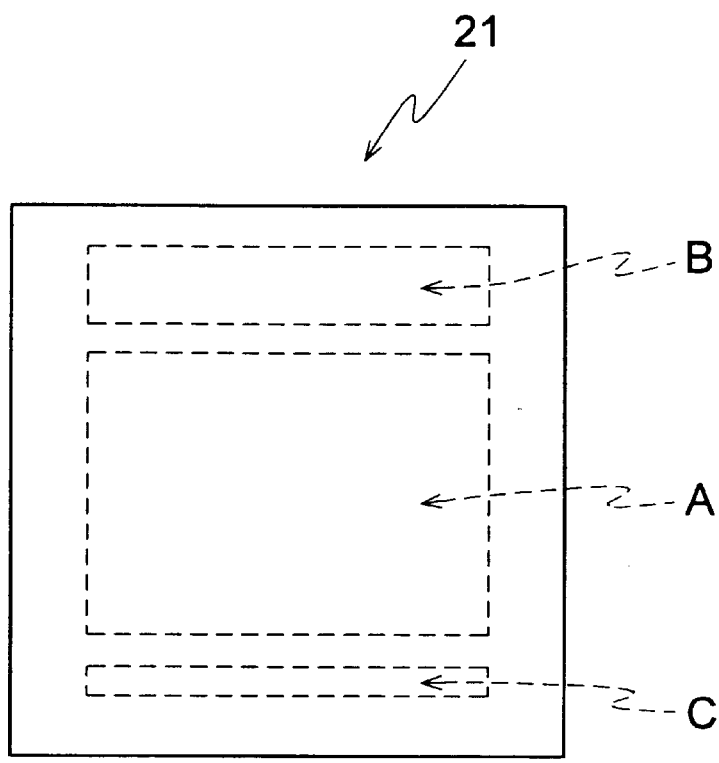
FIGS. 2(a) and 2(b) are each explanatory view showing a layout on the mask used in manufacturing the TFT array of EMBODIMENT 1 of the present invention.
Figure 2B:
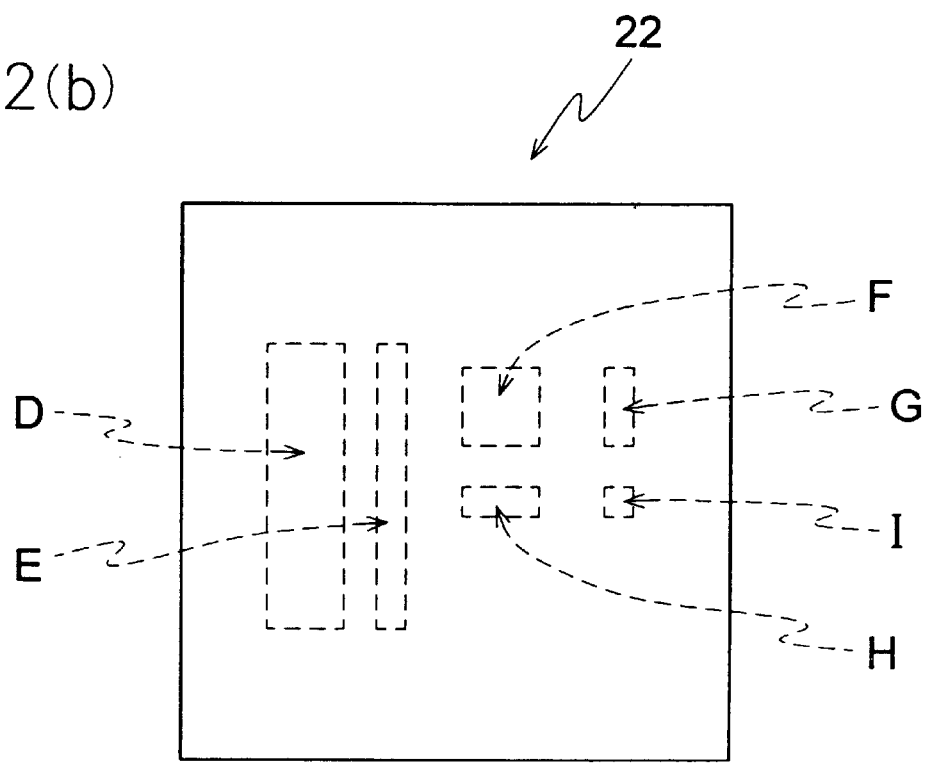
Figure 3:
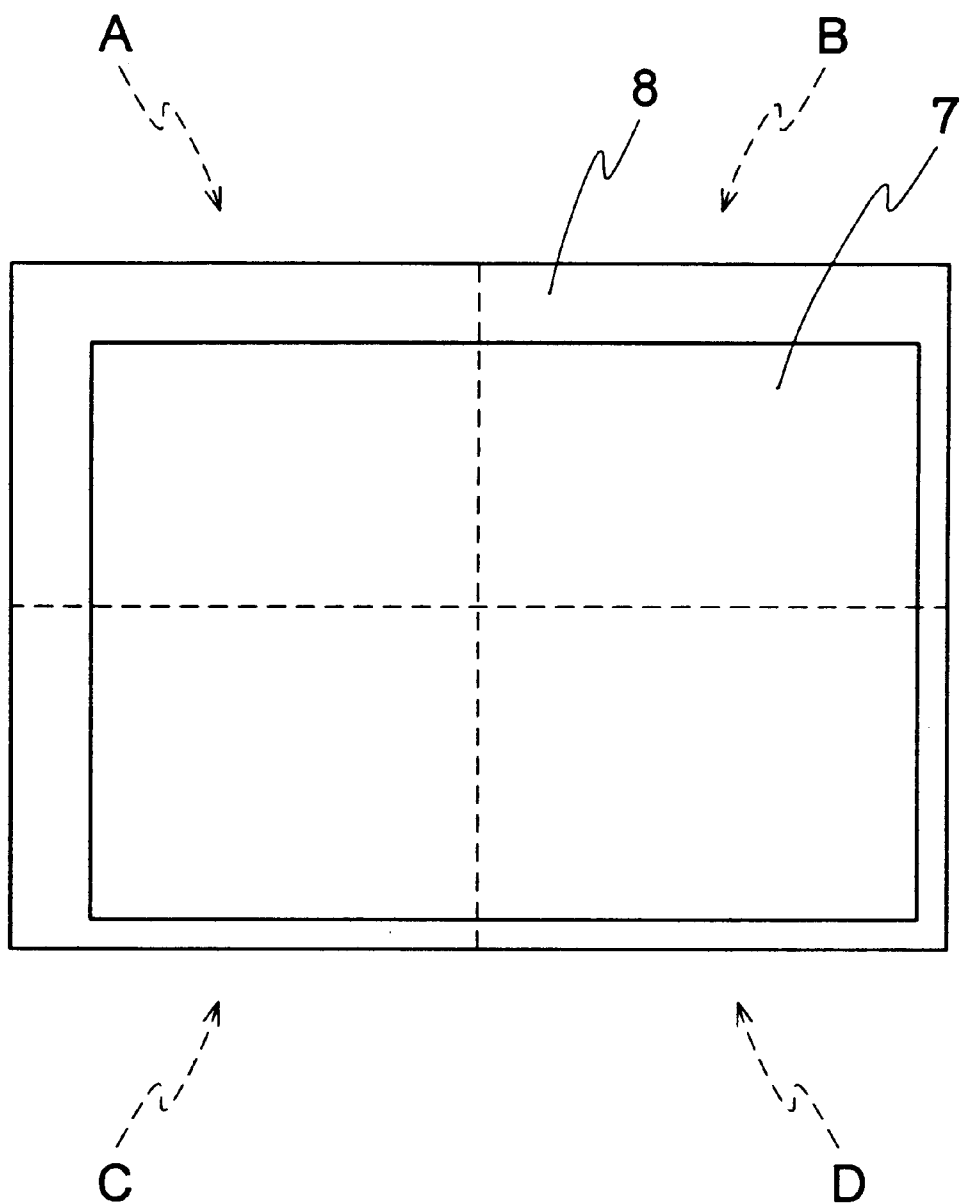
FIG. 3 is an explanatory view showing a method of divisional exposure in forming portions except for pixel electrode and counter electrode of the present invention or prior art.
Figure 4:
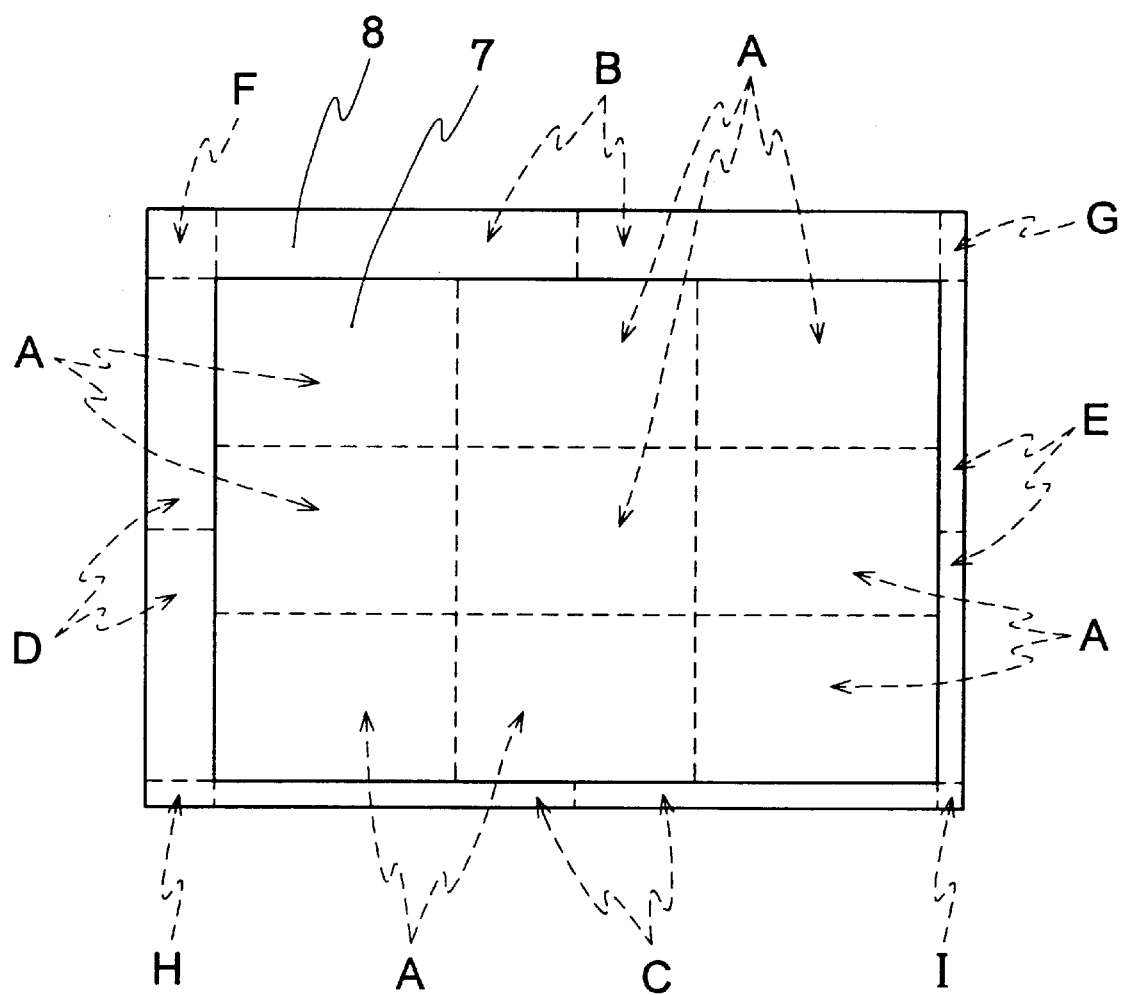
FIG. 4 is an explanatory view showing a method of divisional exposure of the TFT array of EMBODIMENT 2 of the present invention.
Figure 5A:
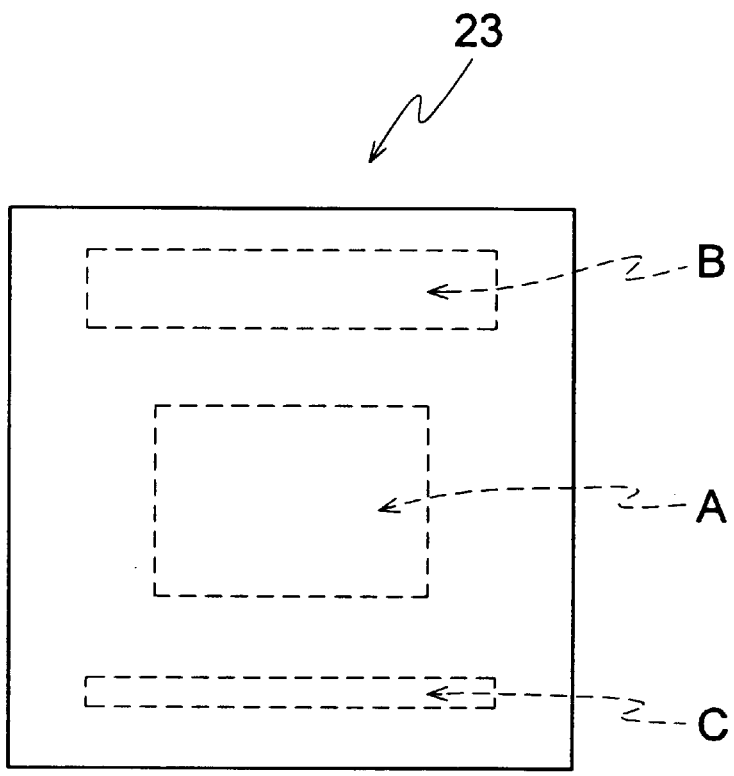
FIGS. 5(a) and 5(b) are each an explanatory view showing an example of layout on the mask used in manufacturing the TFT array of EMBODIMENT 2 of the present invention.
Figure 5B:
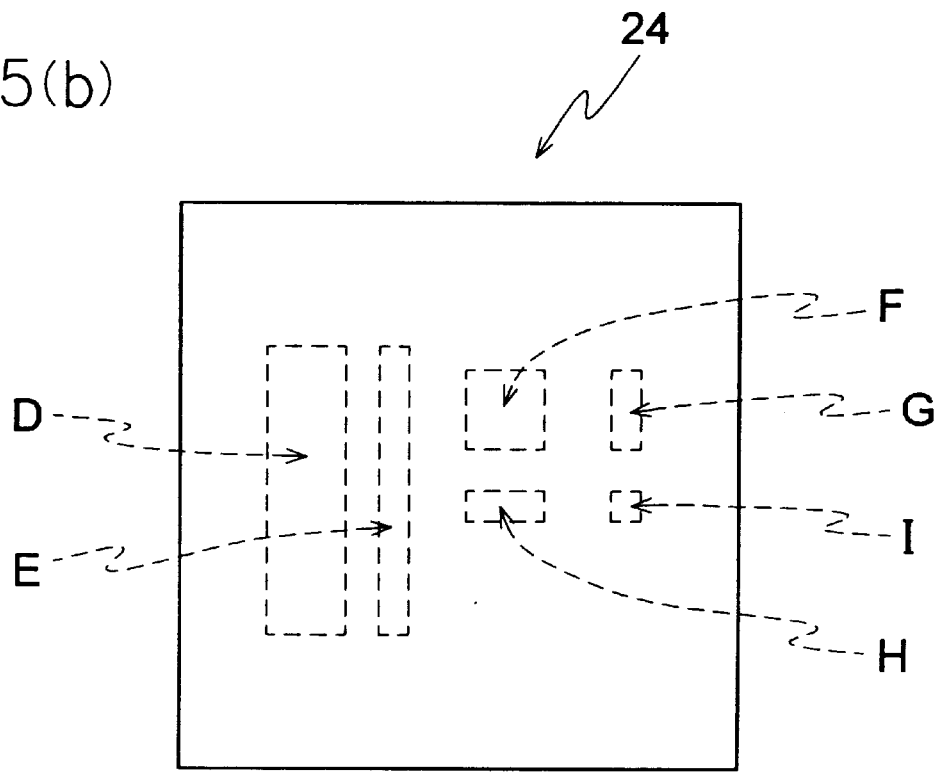

The following will describe a substrate of a TFT array according to EMBODIMENT 1 of the present invention and a method of manufacturing a liquid crystal display apparatus having the substrate. First, a gate line 1 is formed by Al, Cr, Mo or W, or alloy mainly containing Al, Cr and Mo, or a laminated film made of them. At this time, the gate line 1 and a counter electrode 5 are formed simultaneously. At this time, in order to obtain reliability of a liquid crystal display apparatus, the stepper method is used as exposure in the photolithography process. At this time, in order to prevent scattering of an electrode width due to a difference in dimension between masks from occurring, a pixel section 7 is exposed repeatedly by using one mask, and a terminal section 8 is exposed by using another mask. FIGS. 1 and 2(a) to 2(b) show this exposing method. FIG. 1 shows positions on the substrate of the TFT array where the exposure is carried out, and FIGS. 2(a) to 2(b) schematically show positions of masks 21 and 22 where the exposure is carried out. As for the pixel section shown in FIG. 1, the portions A shown in FIG. 2(a) are exposed repeatedly, for example, four times. As for the terminal section, the portions shown by portion B through I in FIG. 2(a) and FIG. 2(b), which are represented by portion B through I in FIG. 1, are exposed. After a gate insulating film is formed on the whole surface, amorphous silicon 12 and amorphous silicon 13 including impurity are formed simultaneously. When the amorphous silicon 12 and the amorphous silicon 13 with which impurity was doped are formed, exposure may be carried out by the method shown in FIGS. 1 and 2, but one panel including the terminal section is divided into not less than two, for example, four portions as shown in FIG. 3, and the respective patterns may be exposed by using different masks. In the method shown in FIGS. 1 and 2(a) to 2(b), sixteen times of exposure is required, but when the exposure is carried out in a manner shown in FIG. 3, a number of times of the exposure is only four, so throughput can be prevented from being lowered greatly. Next, a signal line 2 and a pixel electrode 6 are formed by Al, Cr, Mo or W, or alloy mainly containing them, or a laminated film made of them by using the exposing method shown in FIGS. 1 and 2(a) to 2(b) at the same time when a source/drain electrode of the TFT is formed. After a passivation film made of silicon nitride or silicon oxide is formed on the whole surface, the passivation film on the terminal is removed so that the substrate of the TFT array is produced. A counter substrate is laminated on the pixel section of the substrate of the TFT array with liquid crystal being sandwiched therebetween, a circuit for transmitting image signals to the gate line and the signal line is mounted to the terminal section 8, and a back light is mounted to a rear surface of the substrate of the TFT array so that the liquid crystal display apparatus is manufactured.

EMBODIMENT 2

In the EMBODIMENT 1, the counter electrode 5 which is formed simultaneously with the gate line 1, and the pixel electrode 6 which is formed simultaneously with the signal line 2 were exposed by using the method shown in FIGS. 1 and 2(a) to 2(b), but exposure may be carried out so that the boundary is in a different position on the pixel section. For example, the gate line 1 and the counter electrode 5 are exposed by the method shown in FIGS. 1 and 2(a) to 2(b), and the signal line 2 and the pixel electrode 6 are exposed by using masks 23 and 24 shown in FIGS. 4 and 5(a) to 5(c) in a manner that the pixel section is divided into more portions. As a result, positions where widths of the pixel electrode 6 and the counter electrode 5 are changed can be in different positions, so unevenness on the boundary of exposure is hardly seen. Moreover, when the pixel electrode 6 is exposed, a portion used for an exposed area by the exposing apparatus is small, so distribution of exposing energy of the exposing apparatus can be small, and thus a change in the electrode widths due to the distribution can be small.

EMBODIMENT 3

Figure 6:
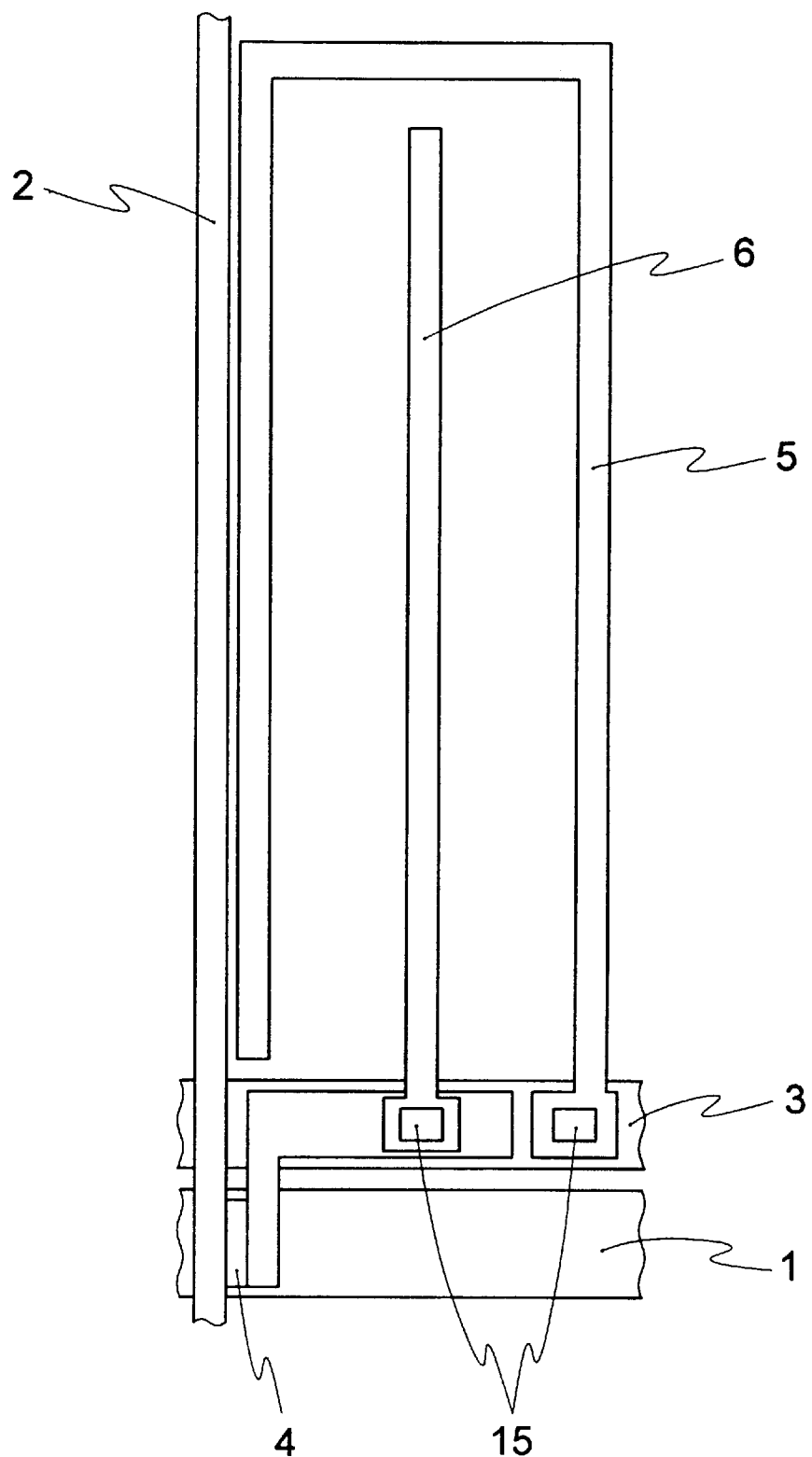
FIG. 6 is a plan view showing a pixel of the TFT array of EMBODIMENT 3 of the present invention.
Figure 7A:
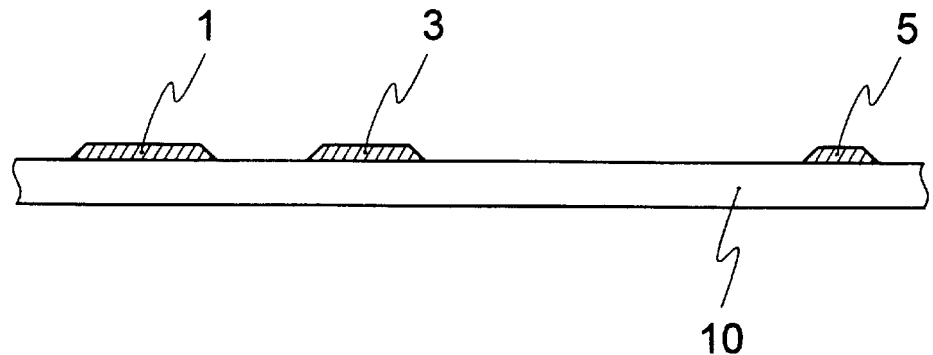
FIGS. 7(a), 7(b) and 7(c) are each a cross sectional view showing a step for manufacturing the TFT array of EMBODIMENT 3 of the present invention.
Figure 7B:
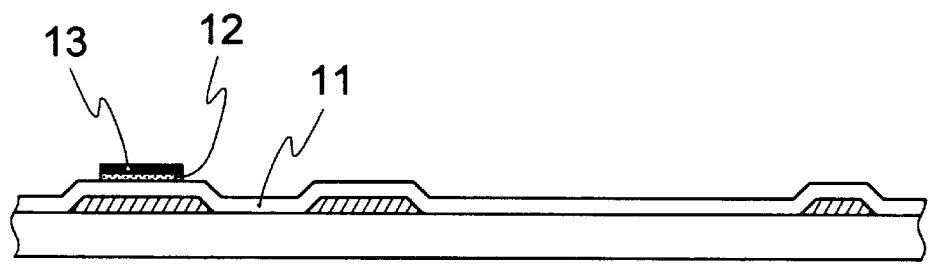
Figure 7C:
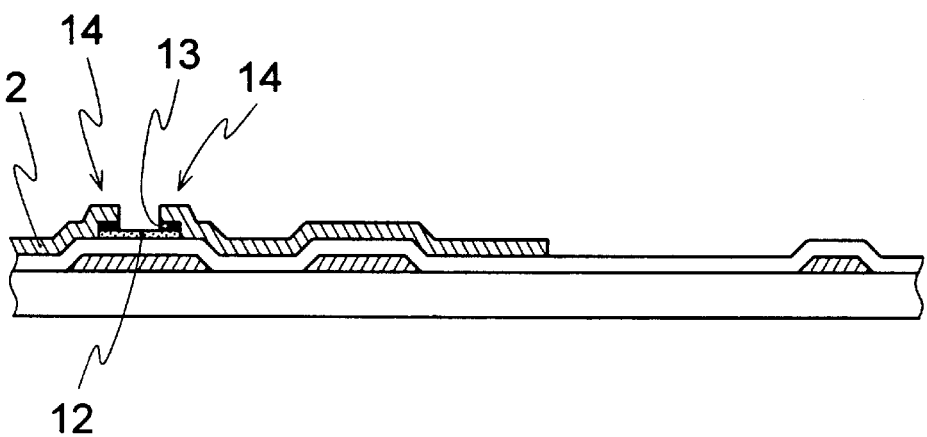
Figure 8A:
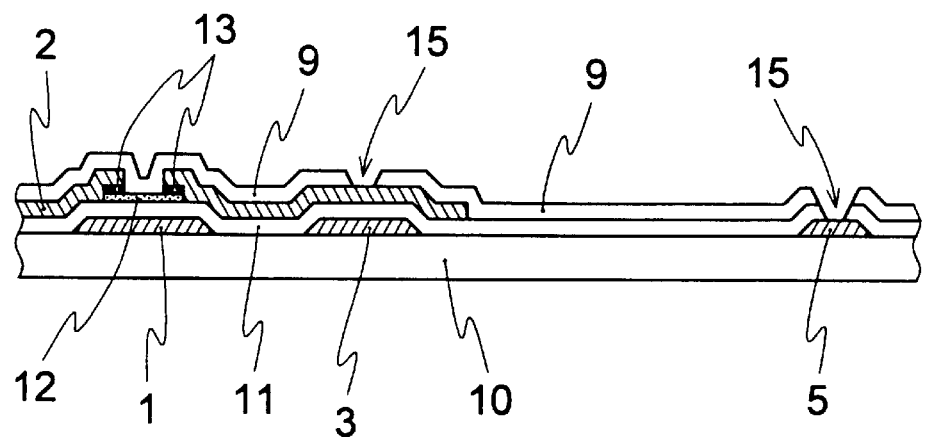
FIGS. 8(a) to 8(b) are each a cross sectional view showing a step for manufacturing the TFT array of EMBODIMENT 3 of the present invention.
Figure 8B:
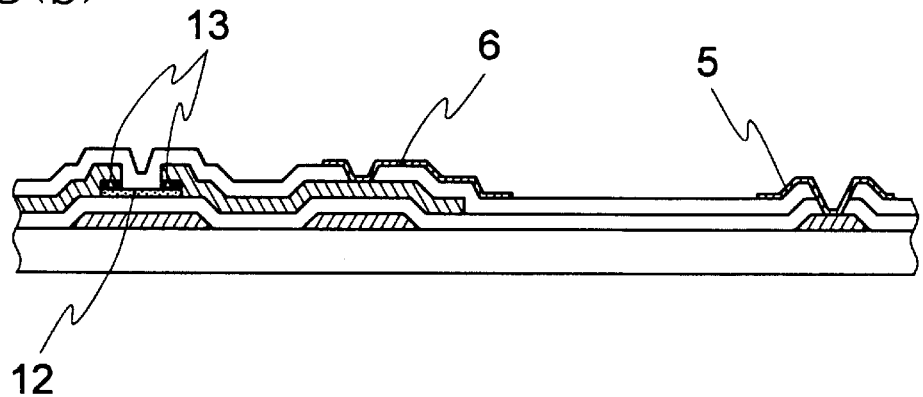
Figure 9:
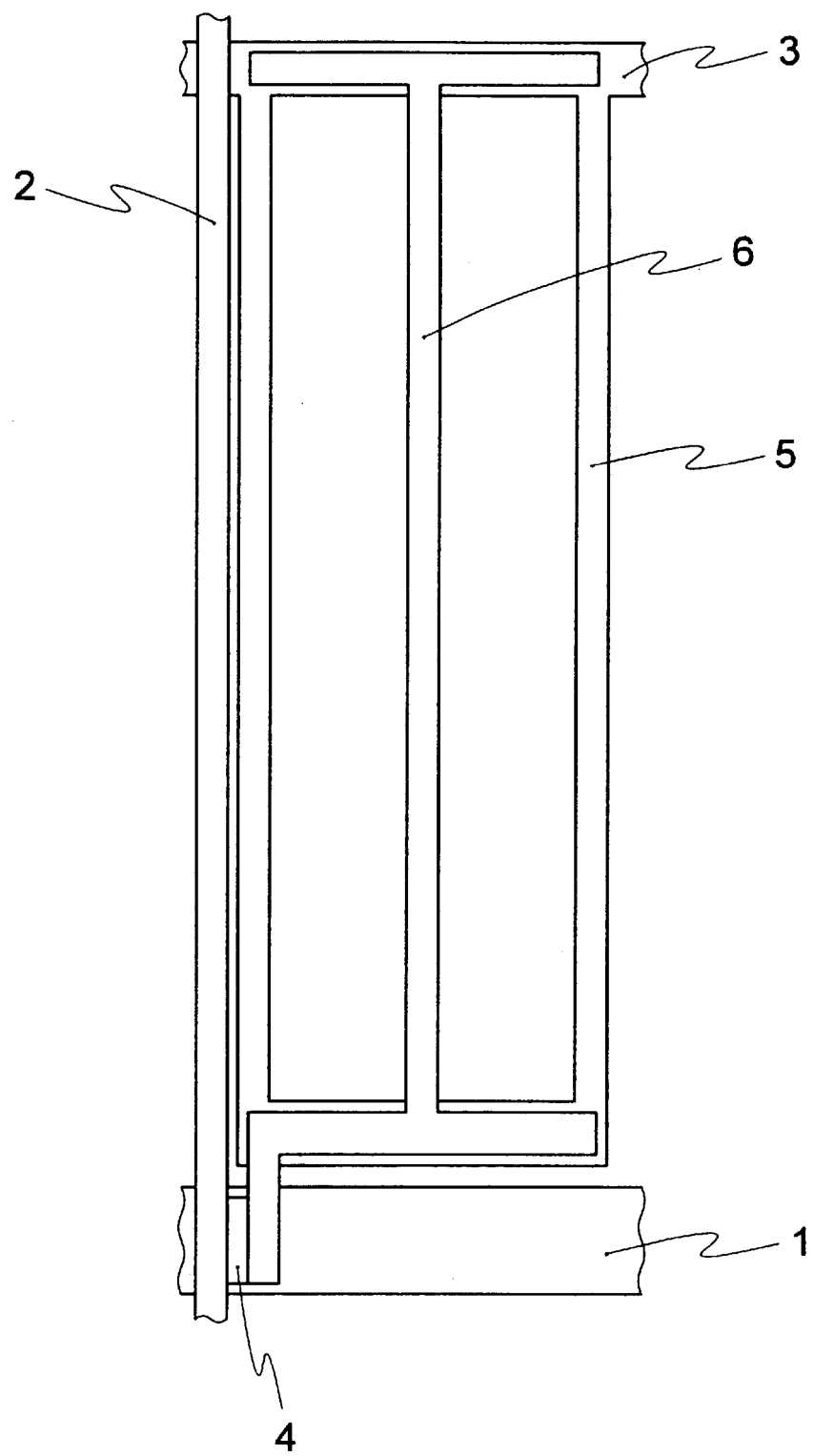
FIG. 9 is a plan view showing a pixel of the TFT array of EMBODIMENT 1 or EMBODIMENT 2 of the present invention.
Figure 11A:
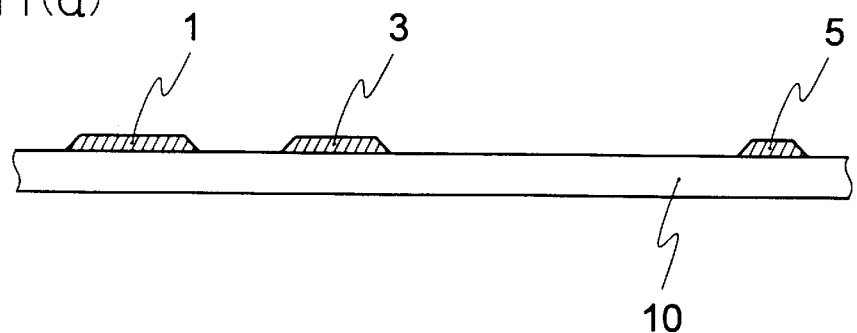
FIGS. 11(a) to 11(d) are each a cross sectional view showing a step for manufacturing the TFT array of EMBODIMENT 1 or EMBODIMENT 2 of the present invention or prior art.
Figure 11B:
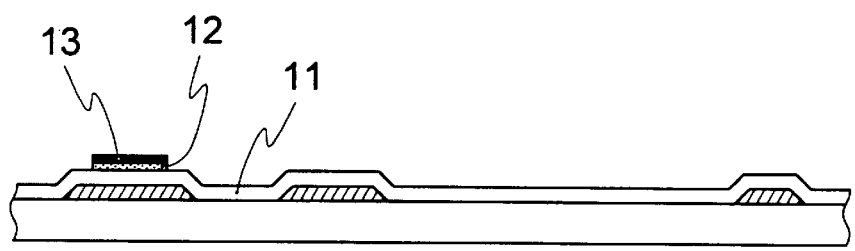
Figure 11C:
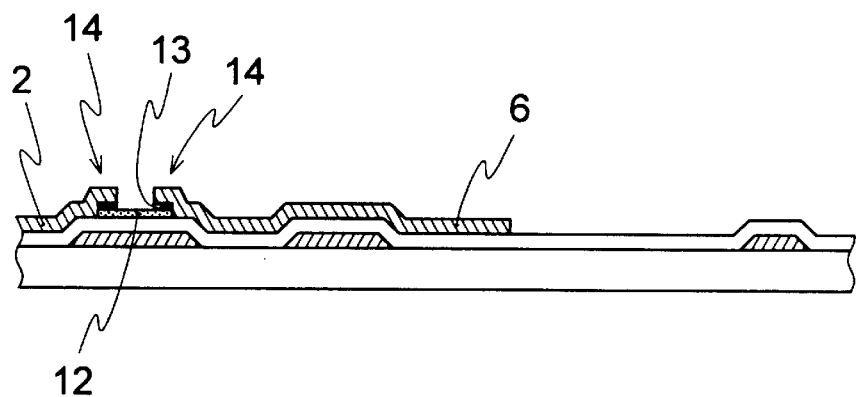
Figure 11D:
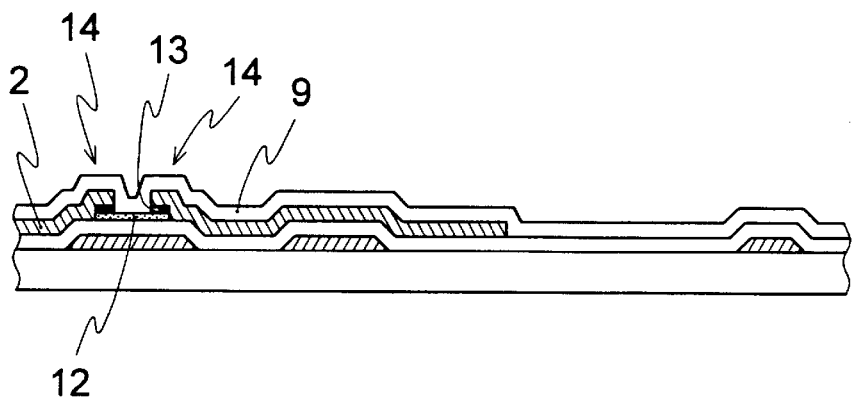
Figure 12:
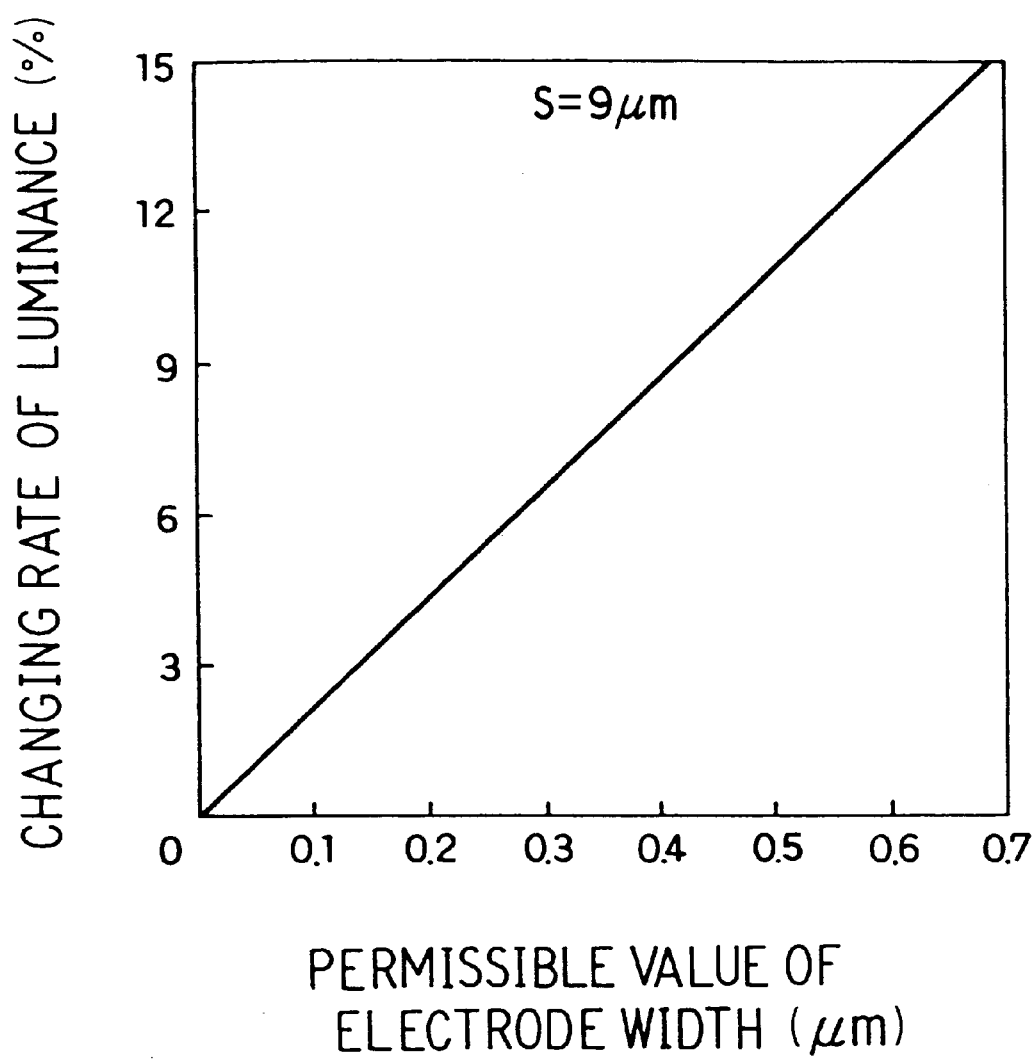
FIG. 12 is a graph showing a result of obtaining a relationship between a changing amount of an electrode width and a changing rate of luminance of lateral electric field LCD.

The EMBODIMENTS 1 and 2 refer to the case where the counter electrode 5 and the pixel electrode 6 are formed on different layers, but they may be formed on the same layer. FIG. 6 shows an example of a plan view of one pixel. The pixel electrode 6 and the counter electrode 5 are connected respectively with the source drain electrode 14 and the common line 3 via contact holes 15. The following will describe an example of the manufacturing method according to the sectional view showing the process in FIGS. 11(a) to 11(d). First, the gate line 1 is formed by Al, Cr, Mo or W, or alloy mainly containing them, or a laminated film made of them (FIG. 7(a)). Next, after the gate insulating film is formed on the whole surface, the amorphous silicon 12 and the amorphous silicon 13 with which impurity was doped are formed (FIG. 7(b)). Further, the signal line 2 is formed by Al, Cr, Mo or W, or alloy mainly containing them or a laminated film made of them simultaneously with the source/drain electrode 14 of the TFT. Thereafter, the amorphous silicon 13 with which impurity was doped is removed by dry etching or the like by using the source/drain electrode 14 as a mask (FIG. 7(c)). After a passivation film made of silicon nitride or silicon oxide is formed on the whole surface, the contact holes 15 are formed on the source/drain electrode 14 and the common line 3(FIG. 8(a)). In the above process, the stepper method is used, and, for example, exposure is carried out by the method shown in FIG. 3. Next, the pixel electrode 6 and the counter electrode 5 are formed simultaneously by Al, Cr, Mo or W, or alloy mainly containing them, or a laminated film made of them (FIG. 8(b)). As the exposing method at this time, the method shown in FIGS. 1 and 2(a) and 2(b) is used, and a change in the electrode widths at a joint of the divisional exposure is made to be small. A counter substrate is laminated on the pixel section of the substrate of the TFT array with liquid crystal being sandwiched therebetween, a circuit for transmitting image signals to the gate line and the signal line is mounted to the terminal section 8, and a back light is mounted so that the liquid crystal display apparatus is manufactured. As a result, a layer, which is necessary to be formed so that accuracy of the electrode width becomes high, can be arranged as one layer.

EMBODIMENT 4

In the EMBODIMENT 3, when the pixel electrode 6 and the counter electrode 5 are formed, the exposure was carried out by using the method shown in FIGS. 1 and 2(a) to 2(b), but collective exposure may be carried out by the mirror projection method. Namely, the gate line 1, the amorphous silicon 4, the signal line 2 and the contact holes are formed by the stepper method, and the pixel electrode 6 and the counter electrode 5 are formed by the exposure using the mirror projection method. As a result, the characteristic and capacitance of the TFT are not scattered in the plane and thus the liquid crystal display apparatus with high reliability can be manufactured, but since the layers where the pixel electrode and the counter electrode are formed are not divisionally exposed, satisfactory display in which the boundary of the divisional exposure is not visible can be obtained.

EMBODIMENT 5

In the EMBODIMENTS 1 through 3, when a thickness of a photoresist at the time of forming the pixel electrode 6 or the counter electrode 5 is set to be larger, the exposing time becomes longer, and thus the influence exerted on the electrode widths due to the scattering of the shutter speed of the exposing apparatus can be small. If this method is used on the other layers, a cost of a material of the photoresist becomes high, and the throughput is lowered due to extension of the exposing time, so only the photoresist, which forms the pixel electrode 6 or the counter electrode 5 or both of them, is made to be thicker.

EMBODIMENT 6

In the EMBODIMENTS 1 through 3, as the photoresist used for the pixel electrode 6 or the counter electrode 5, photoresist, in which a change in its pattern width is smaller with respect to a change in the exposing energy, is used. As a result, an influence exerted on the electrode widths due to distribution of the energy and the scattering of the shutter speed of the exposing apparatus can be small. In general, since photoresist, in which a change in its pattern width is smaller with respect to a change in the exposing energy, is expensive, such photoresist is used only for forming the pixel electrode 6, or the counter electrode 5 or both of them, and thus an increase in the cost is prevented.

EMBODIMENT 7

In the EMBODIMENTS 1 through 3, when a phase shifting mask is used for forming the pixel electrode 6 or the counter electrode 5, the influence exerted on the electrode widths due to the distribution of the exposing energy and the scattering of the shutter speed of the exposing apparatus can be small. The phase shifting mask is such that a phase shifter is added to a chromium mask so that high resolution and high density of a transfer pattern are achieved. A phase shifting mask is generally expensive, and phase shift masks other than those having a slit shape is hardly produced, so such a mask may be used for forming the pixel electrode 6, the counter electrode 5 or both of them.

EMBODIMENT 8

In the EMBODIMENTS 1 through 3, when an in-plane dimension tolerance of a mask used for forming the pixel electrode 6 or the counter electrode 5 is made to be small, an influence exerted on the electrode widths due to the in-plane tolerance of the dimension on the mask can be small. In general, the dimension tolerance of the mask used for manufacturing a liquid crystal display apparatus is ±0.2 to 0.5 $\mu$m, but as mentioned above, in the liquid crystal display apparatus adopting the lateral direction electric field method, it is necessary to suppress a change in the electrode widths within about S/30 $\mu$m. Therefore, it is necessary to suppress the in-plane dimension tolerance of the mask used for forming the pixel electrode 6 or the counter electrode 5 within at least ±S/60 $\mu$m. That is, the in-plane dimension tolerance is about ±0.17 $\mu$m in the case where the electrode width is 10 $\mu$m. The higher precision mask is preferably used, because the scattering or fluctuation of the electrode width caused by in-plane distribution of exposed light energy produced in an exposing apparatus. However, since the mask which was manufactured with high accuracy is expensive, this mask may be used only for forming the pixel electrode 6, the counter electrode 5 or both of them. Moreover, such a mask is generally formed by processing chromium and chromium oxide according to the wet etching method, but the in-plane dimension tolerance of the mask can be small by processing it according to the dry etching method.

As mentioned above, according to the present invention, the liquid crystal display apparatus, which adopts the lateral electric field method and has a wide viewing angle, can be manufactured with the reliability being maintained by using the stepper method and unevenness at the boundary of the divisional exposure being reduced. Moreover, according to the method of the EMBODIMENT 4, the liquid crystal display can be realized without a change in the electrode widths at the boundaries of the divisional exposure and with few luminance unevenness at the boundaries of the divisional exposure.

In the method of manufacturing a liquid crystal display apparatus according to the invention, wherein a liquid crystal display apparatus is manufactured so that a counter electrode opposed to a pixel electrode is included and an electric field whose direction is horizontal to the surface of a substrate is applied between the pixel electrode and the counter electrode and thus liquid crystal is driven, when a pixel section is exposed repeatedly through one mask so as to be patterned. Accordingly, since the exposure is carried out repeatedly by using one mask, this method produces an effect that scattering of the electrode widths does not occur.

In a method of manufacturing a liquid crystal display apparatus according to the invention, wherein the liquid crystal display apparatus is manufactured so that a counter electrode opposed to a pixel electrode is provided and an electric field whose direction is horizontal to the surface of a substrate is applied between the pixel electrode and the counter electrode and thus liquid crystal is driven, when a pixel section on at least one of layers where the pixel electrode and the counter electrode are formed is exposed, its exposed area is smaller than the other layers. Therefore, this method produces an effect that unevenness at the boundaries of the exposure is hardly seen.

In a method of manufacturing a liquid crystal display apparatus according to the invention, wherein the liquid crystal display apparatus is manufactured so that a counter electrode countered to a pixel electrode is provided and an electric field whose direction is horizontal to the surface of a substrate is applied between the pixel electrode and the counter electrode and thus liquid crystal is driven, when a pixel section on at least one of layers where the pixel electrode and the counter electrode are formed is exposed, the exposure is carried out repeatedly by using one mask so that patterning is carried out, the other layers are exposed and patterned by using masks obtained by dividing one panel including the terminal section into two or more. Therefore, this method produces an effect that the throughput can be prevented from being lowered greatly.

In a liquid crystal display apparatus according to the invention, wherein the liquid crystal display apparatus includes a counter electrode opposed to a pixel electrode is provided and an electric field whose direction is horizontal to the surface of a substrate is applied between the pixel electrode and the counter electrode, such that liquid crystal is driven, since a difference between widths of the pixel electrode and the counter electrode at the boundary of divisional exposure is not more than S/30 $\mu$m maximumly. Therefore, this method produces an effect that a liquid crystal display apparatus which adopts the lateral direction electric field method and has a wide viewing angle can be manufactured with its reliability being maintained by using the stepper method and unevenness at the boundary of divisional exposure being reduced.

What is claimed is:

1. A method of manufacturing a liquid crystal display apparatus in which a pixel electrode and a counter electrode opposed to the pixel electrode are included in a TFT array substrate, a liquid crystal is driven by applying an electric field between the pixel electrode and the counter electrode, a direction of the electric field being horizontal to the surface of the TFT array substrate; said method comprising a step of repeatedly exposing a pixel section through one mask so as to be patterned.

2. The method of claim 1, wherein the TFT array substrate is formed with a plurality of layers, said exposed area of the pixel section on at least one of layers where the pixel electrode and the counter electrode are formed is smaller than the other layers.

3. The method of claim 2, wherein an in-plane dimension tolerance between the pixel electrode and the counter electrode is at most ±S/60 μm in the mask when the distance between the pixel electrode and the counter electrode is Sμm.

4. The method of claim 1, wherein an in-plane dimension tolerance between the pixel electrode and the counter electrode is at most ±S/60 μm in the mask when the distance between the pixel electrode and the counter electrode is Sμm.

5. A method of manufacturing a liquid crystal display apparatus in which a pixel electrode and a counter electrode opposed to the pixel electrode are included in a TFT array substrate, a liquid crystal is driven by applying an electric field between the pixel electrode and the counter electrode, a direction of the electric field being horizontal to the surface of the TFT array substrate, said method comprising a step of exposing a pixel section on at least one of layers where the pixel electrode and the counter electrode are formed by repeatedly exposing the pixel section through one mask so as to be patterned, and exposing the other layers using masks obtained by dividing one panel including a terminal section into two or more as to be patterned.

6. A method of of manufacturing a liquid crystal display apparatus in which a pixel electrode and a counter electrode opposed to the pixel electrode are included in a TFT array substrate, a liquid crystal is driven by applying an electric field between the pixel electrode and the counter electrode, a direction of the electric field being horizontal to the surface of the TFT array substrate; said method comprising the step of exposing the pixel section on at least one of layers where the pixel electrode and the counter electrode are formed by repeatedly exposing the pixel section through one mask so as to be patterned, and wherein an in-plane dimension tolerance between the pixel electrode and the counter electrode is at most ±S/60 μm in the mask when the distance between the pixel electrode and the counter electrode is Sμm.

* * * * *